United States Patent [19]
Pulluru et al.

[11] Patent Number: 5,455,493
[45] Date of Patent: Oct. 3, 1995

[54] MULTISYNC HORIZONTAL DRIVE GENERATOR

[75] Inventors: Kishan R. Pulluru, Willowbrook; Khosro M. Rabii, Arlington Heights, both of Ill.

[73] Assignee: Zenith Electronics Corporation, Del.

[21] Appl. No.: 132,064

[22] Filed: Oct. 4, 1993

[51] Int. Cl.$^6$ .............................. H01J 29/70; H01J 29/76
[52] U.S. Cl. ............................................ 315/408; 327/132
[58] Field of Search ..................................... 315/408, 411; 328/183

[56] References Cited

U.S. PATENT DOCUMENTS 4,547,710  10/1985  Bond et al. ............................ 315/403

*Primary Examiner*—Theodore M. Blum

[57] ABSTRACT

A multisync horizontal drive generator for use in a television receiver or computer monitor display is operative in response to an applied horizontal scan synchronizing signal. A delay network couples the horizontal sync signal to a gated detector which compares the delayed horizontal sync signal to a differentiated horizontal scan flyback signal to produce an error signal. A gain adjustable error amplifier couples the error signal to a summing network which includes a nominal frequency input. A range control detects the frequency of the horizontal drive signal and applies a range control signal to the summing network. The combined signal inputs are coupled from the summing network to a signal controllable current source which drives a saw forming network to produce a horizontal scan signal. A multiscan decoder controls a pair of current mirrors in response to a multiscan code input to couple the output currents of the current mirror to the saw former to produce horizontal scan drive signals having frequency multiples of the horizontal sync frequency.

16 Claims, 3 Drawing Sheets

5,455,493

MULTISYNC HORIZONTAL DRIVE GENERATOR

FIELD OF THE INVENTION

This invention relates generally to raster scanned video displays and particularly to those having multisync horizontal drive requirements.

BACKGROUND OF THE INVENTION

In cathode ray tube display systems of the type generally used in television receivers and computer monitors, one or more electron beams within the cathode ray tube are scanned horizontally and vertically with respect to a phosphor coated faceplate to define a raster. In general, the vertical or top to bottom direction scan is substantially slower than the horizontal or left to right direction scan. The picture or video information to be displayed is used to intensity modulate the beam or beams within the CRT to form a displayed image.

The proper image display requires that the intensity modulation of the cathode ray tubes with video or picture information be properly timed to the horizontal and vertical scan process. In most systems, a plurality of horizontal and vertical synchronizing signals generally referred to as "sync" are included within the image bearing signal during the transmission process or in other signal production processes such as computer generated video or the operation of video cassette recorders. Within the television receiver or computer monitor, the reference horizontal and vertical synchronizing signals are separated from the remainder of the signal and used to synchronize or properly time the horizontal and vertical scan processes.

Because the basic operations of television and computer monitor scan systems are generally similar, manufacturers often endeavor to provide a single scan system which is operable in both television receivers and computer monitors. Unfortunately, while this is economically desirable, several problems must be overcome to provide such a multi-use scan system. For example, broadcast or cable television signals utilize a single horizontal sync frequency while computer monitors operate using a variety of horizontal scan frequencies. In addition, television related devices such as video cassette recorders and video game units often generate horizontal sync signals which are subject to substantial frequency and phase deviation. In addition, such devices are also subject to excessive noise problems which contaminates the sync signal and further exacerbates the problem of horizontal scan synchronization. Finally, the general character and quality of the sync signal produced by such varied devices is also subject to variation.

Notwithstanding the problems inherent in such multiple use scan synchronizing systems, there remains nonetheless a continuing need in the art for effective, reliable and cost effective multiple use scan systems.

Accordingly, it is a general object of the present object of the present invention to provide an improved multisync horizontal drive generator. It is a more particular object of the present invention to provide an improved multisync horizontal drive generator which readily functions in response to a variety of sync signal quality and frequency characteristics.

BRIEF DESCRIPTION OF THE DRAWINGS

The features of the present invention, which are believed to be novel, are set forth with particularity in the appended claims. The invention, together with further objects and advantages thereof, may best be understood by reference to the following description taken in conjunction with the accompanying drawings, in the several figures of which like reference numerals identify like elements and in which:

DESCRIPTION OF THE PREFERRED EMBODIMENT

Figure 1:
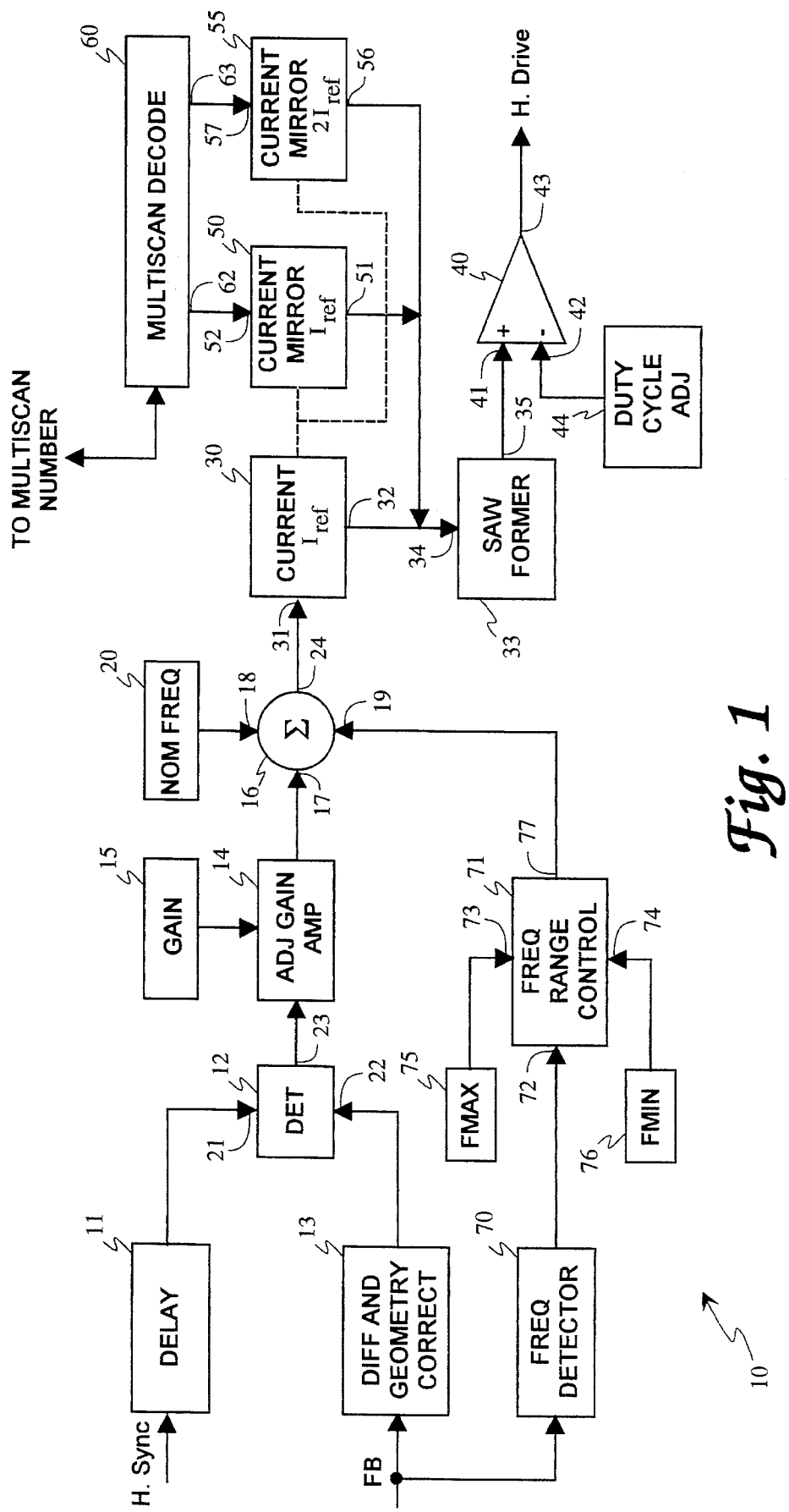
FIG. 1 sets forth a generalized block diagram of a multisync horizontal drive generator constructed in accordance with the present invention.

FIG. 1 sets forth a block diagram of a multisync horizontal drive generator constructed in accordance with the present invention and generally referenced by numeral 10. Horizontal drive generator 10 includes a delay circuit 11 coupled to a source of horizontal sync signal (not shown). A differentiating and geometry correcting circuit 13 is coupled to a source of horizontal scan flyback pulse (not shown). A gated detector 12 includes an input 21 coupled to delay circuit 11, an input 22 coupled to differentiating and geometry correcting circuit 13 and an output 23. An adjustable gain error amplifier 14 is coupled to output 23 of detector 12 and includes a gain control 15 operative upon amplifier 14 to adjust the signal gain within amplifier 14. A summing network 16 includes an input 17 coupled to the output of amplifier 14, an input 18 coupled to a nominal frequency voltage source 20, an input 19, and an output 24.

A frequency detector 70 is coupled to the source of horizontal scan flyback signal applied to differentiating and geometry correcting circuit 13. A frequency range control 71 includes an input 72 coupled to the output of frequency detector 70, an input 73 coupled to a maximum frequency voltage source 75, an input 74 coupled to a minimum frequency voltage source 76, and an output 77 coupled to input 19 of summing network 16.

A current source 30 includes an input 31 coupled to output 24 of summing network 16 and an output 32. A saw forming network 33 includes an input 34 coupled to output 32 of current source 30 and an output 35. An amplifier 40 includes an input 41 coupled to output 35 of saw forming network 33, an input 42 coupled to a duty cycle adjusting voltage source 44, and an output 43 forming the horizontal drive signal source for the horizontal scan system (not shown) within which multisync horizontal drive generator 10 is operative.

In operation, a horizontal sync signal is applied to delay circuit 11 and produces a delay in time horizontal sync signal which is applied to input 21 of detector 12. Concurrently, a sample of the horizontal flyback pulse signal produced within the host television receiver or computer monitor within which generator 10 is functioning is applied to differentiating and geometry correcting circuit 13. The flyback signal applied to circuit 13 represents a sample of the high amplitude retrace pulse produced within the horizontal scan system during the retrace interval of the horizontal scan. Differentiating and geometry correcting circuit 13 provides a reshaped and delayed in time sample of the flyback signal which is applied to input 22 of gated detector 12. Detector 12 operates in accordance with conventional fabrication techniques to provide a phase and frequency comparison between the respective applied input signals at inputs 21 and 22 to produce an error signal at output 23 indicative of the phase and frequency relationship therebetween. Thus, detector 12 functions to provide an error signal or correcting signal which may be utilized to provide adjustment of the horizontal drive signal at output 43 of amplifier 40 to properly synchronize horizontal drive generator 10. Amplifier 14 applies a voltage gain to the error signal provided by detector 12 in accordance with the gain adjustment from gain circuit 15. The use of adjustable gain amplifier 14 and gain control 15 facilitates the adjustment of the loop gain within horizontal drive generator 10. This adjustment of loop gain is advantageous to optimize the operation of horizontal drive generator 10 for different qualities and characteristics of sync signal. For example, for highly stable input sync signals such as those produced by computers driving computer monitors or the like, the gain of amplifier 14 may be adjusted to a relatively low gain. This low gain prevents horizontal drive generator 10 from responding to signal perturbations such as those caused by noise within the computer system. Conversely, gain circuit 15 may be adjusted to increase the gain of amplifier 14 to provide increased loop gain for drive generator 10 in order to enable generator 10 to rapidly track less stable input sync signals such as those produced by a video cassette recorder.

The amplified error signal at the output of amplifier 14 is applied to input 17 of summing network 16. In addition, a nominal frequency signal provided by voltage source 20 is applied to input 18 of summing network 16. The function of nominal frequency signal source 20 is to provide a signal corresponding to the nominal or desired frequency of the horizontal scan system.

Current source 30 produces an output current controlled by the applied signal from summing network 16. The output current from current source 30 is applied to a saw wave forming network 33 described below in greater detail. Suffice it to here that saw former 33 converts the applied current from current source to a horizontal scan signal shown in FIG. 3. By means set forth below in greater detail, the horizontal scan signal produced by saw former 33 in response to the current from current source 30 is frequency controlled in response to the applied signal at input 31 of current source 30. This frequency controlled scan signal is amplified by amplifier 40 in a nonlinear fashion to produce an adjustable duty cycle pulse width modulated horizontal drive signal at output 43. The duty cycle of horizontal drive signal at output 43 is controlled by a duty cycle adjustment 44.

Thus, the basic operation of horizontal drive generator 10 is carried forward in the manner described to form a closed loop control system operative upon the frequency and phase of the horizontal drive signal to synchronize the horizontal drive signal to the reference horizontal sync pulses. In performing this phase-locked loop operation, detector 12 forms the basic detector within the phase-locked loop system producing an error signal corresponding to the frequency and phase difference between the reference horizontal sync signal coupled through delay 11 and the horizontal scan system flyback pulse coupled to detector 12 through differentiating and geometry correcting circuit 13. This error signal is then integrated and amplified by amplifier 14 in accordance with loop gain adjustment provided by gain 15 to produce an error signal which is combined with a nominal frequency signal from source 20 within summing network 16. As the error signal produced at detector 12 changes, a corresponding change in the output signal of summing network 16 is produced which deviates above or below the nominal frequency setting from nominal frequency source 20. This varying error signal controls the current within current source 30 which in turn determines the frequency of signal formed in saw former 33 thereby completing the control loop. It will be appreciated that the frequency and phase of the flyback pulse applied to differentiating and geometry correcting circuit 13 is derived from the horizontal scan system response to the horizontal drive signal produced at output 43 of amplifier 40 to complete the phase-locked loop.

Figure 4:
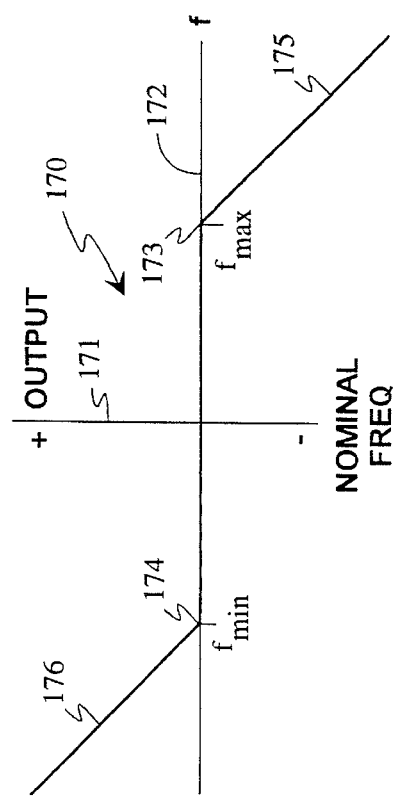
FIG. 4 sets forth a transfer characteristic curve of the range control portion of the present invention multisync horizontal drive generator.

In accordance with an additional important aspect of the present invention, a pair of current mirrors 50 and 55 are operatively coupled to current mirror 30 by conventional means not shown to produce output currents which directly track with the current produced by current source 30 in response to the applied control signal at input 31. In further accordance with the present invention, current mirror 50 produces an output current equal to the current produced by current source 30. Current mirror 55, however, produces an output current which is twice that of current source 30. Importantly, however, both current source 50 and 55 precisely track the output current of current source 30 to maintain the direct one to one relationship between current mirror 50 and current source 30 and the two to one current relationship between current mirror 55 and current source 30. A multiscan decoder 60 is coupled to current mirrors 50 and 55 in a controlling fashion set forth below in greater detail. However, suffice it to note here that multiscan decoder 60 responds to a numeric input at input 61 to enable or disable current mirrors 50 and 55. Because the output currents of current mirrors 50 and 55 are added to the output current of current source 30 and applied to saw forming network 33, multiscan decoder 60 is able to control the current applied to saw former 33 in the form of multiples of the current produced by current source 30. For example, in the event a numeric code is applied to multiscan decoder 60 which defines the basic frequency of the horizontal scan system as equal to the frequency of horizontal sync signals at the input of delay circuit 11, multiscan decoder 60 disables both current mirrors 50 and 55 and saw former 33 receives the single output current of current source 30. If, however, a frequency twice that of the horizontal sync signal frequency is required, the numeric code applied to multiscan decoder 60 causes decoder 60 to disable current mirror 55 and enable current mirror 50. The result is an input current to saw forming network 33 which is twice that of current source 30. By means set forth below in greater detail, saw forming differentiating and geometry correcting circuit 13 is further applied to a frequency detector 70. Frequency detector 70 responds to the applied flyback signal to produce an output signal indicating the frequency of the applied flyback signal which is applied to frequency range control 71. Range control 71 defines a transfer characteristic shown in FIG. 4 in which a frequency minimum and frequency maximum are established. Frequency range control 71 compares the applied frequency indicative signal at input 71 from detector 70 to the frequency maximum and frequency minimum and so long as the frequency of the horizontal scan flyback signal is between the frequency maximum and minimum no output signal is applied to summing network 16. If, however, the frequency of the horizontal scan flyback signal exceeds the maximum frequency, a frequency reducing output signal is produced by frequency range control 71 which is applied to summing network 16 to change the output signal of summing network 16 in a frequency reducing direction. Conversely, in the event the frequency of horizontal scan flyback signal decreases below the established frequency minimum, range control 71 produces a frequency increasing signal which is applied to summing network 16 to change the output signal of network 16 in a frequency increasing direction.

Thus, the combination of frequency detector 70 and range control 71 operates to assure that the frequency of horizontal network 33 responds to a double current by producing a frequency signal which is also doubled. Similarly, in the event a horizontal drive signal having a frequency multiple of three times the frequency of the applied horizontal sync is required, the numeric code applied to multiscan decoder 60 causes multiscan decoder 60 to disable current mirror 50 and enable current mirror 55. The result is a combined current applied to saw forming network 33 which is three times that of the current produced by current source 30 resulting in the production of a horizontal scan signal having a three times greater frequency. Finally, in the event a horizontal scan frequency equal to four times the sync signal frequency is required, the numeric code applied to multiscan decoder 60 causes decoder 60 to enable both current mirror 50 and 55 thereby applying a total current to saw forming network 33 which is four times the current of current source 30 produces a four times increased frequency horizontal drive signal. In accordance with an important aspect of the present invention, the use of current mirrors 50 and 55 to provide the multiplication of current applied to saw former 33 maintains the phase-locked loop control and precision of the present invention horizontal drive generator in that all currents are, in effect, controlled by the phase-locked loop system operative upon current source 30.

In accordance with a further important aspect of the present invention system, the horizontal scan flyback signal applied to drive signal produced by generator 10 is maintained within a predetermined frequency range.

Figure 2:
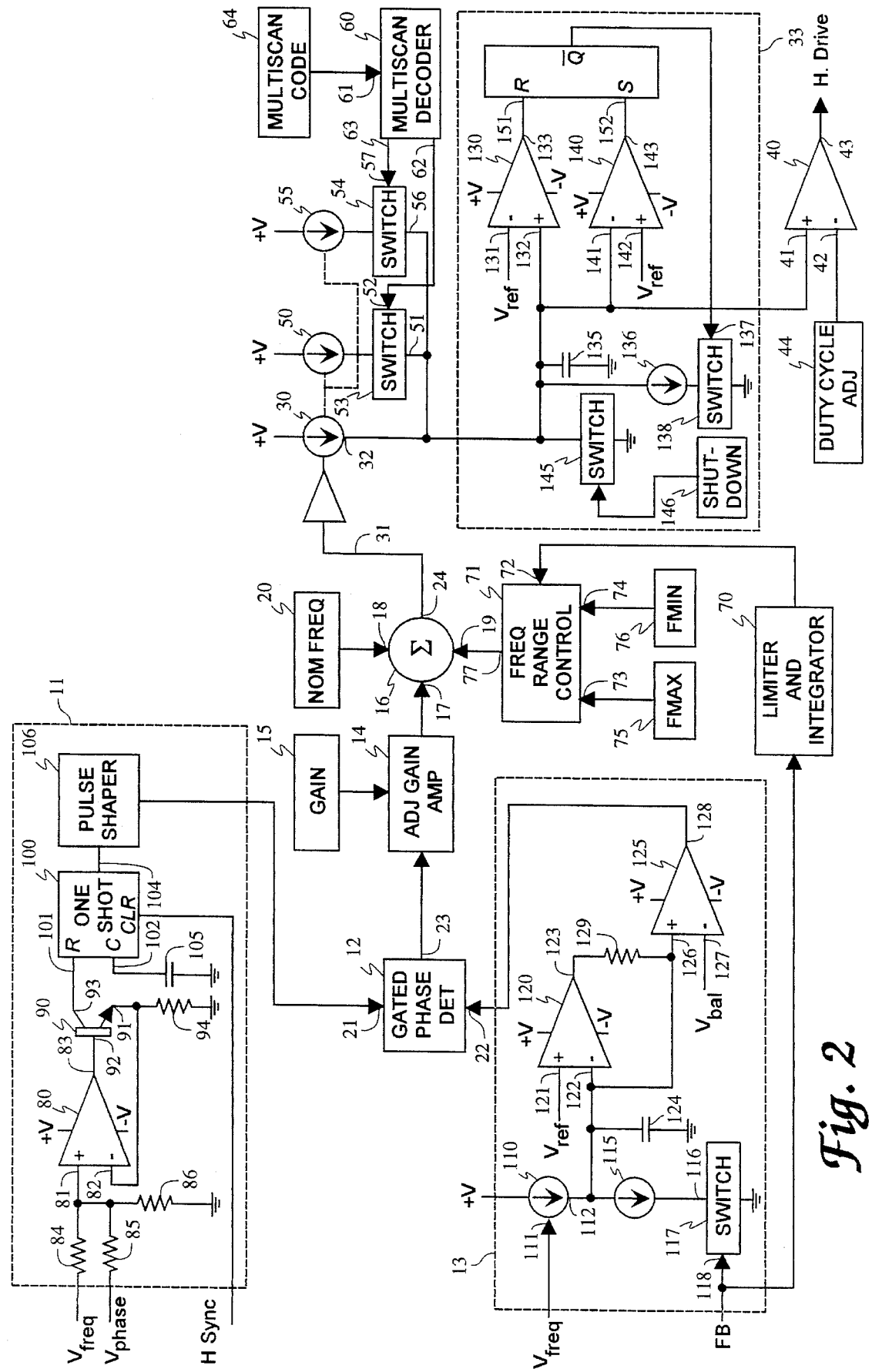
FIG. 2 sets forth a partial schematic, partial block diagram of the present invention multisync horizontal drive generator.

FIG. 2 sets forth a partial schematic partial block diagram of the present invention multisync horizontal drive generator generally referenced by numeral 10. Horizontal drive generator 10 includes a delay network 11 having an input 81 coupled to ground by a resistor 86, an input 82 and an output 83. A pair of resistors 84 and 85 couple input 81 to sources of DC frequency and phase signal representing the frequency and desired phase of the horizontal scan system and generally corresponding to horizontal centering controls. An NPN transistor 90 includes an emitter 91 coupled to ground by a resistor 94 and further coupled to input 82 of amplifier 80, a base 92 coupled to output 83 of amplifier and a collector 93. A one shot multivibrator 100 includes an input 101 coupled to collector 93 of transistor 90, an input 102 coupled to ground by a capacitor 105, a clear input 103 coupled to a source of horizontal sync signal (not shown) and an output 104. A pulse shaper 106 couples output 104 of one shot multivibrator 100 to input 21 of gated phase detector 12. Gated phase detector 12 includes an input 22 and an output 23.

A differentiating and geometry correcting circuit 13 includes a switch 117 having an input 118 coupled to a source of horizontal scan system flyback signal (not shown). A pair of current sources 110 and 115 are serially coupled to input 116 of switch 117 and to a source of operating potential (not shown). Current source 110 further includes a control input 111 coupled to a source of DC signal representing the desired system frequency (not shown). An amplifier 120 includes an input 121 coupled to a source of reference voltage (not shown), an input 122 coupled to ground by a capacitor 124 and further coupled to the junction of current sources 110 and 115, and an output 123 coupled to input 122 by a resistor 129. Amplifier 120 further includes connections to sources of positive and negative operating supply voltage (not shown). An amplifier 125 includes an input 126 coupled to resistor 129, an input 127 coupled to a source of balance voltage signal (not shown) and an output 128 coupled to input 22 of gated phase detector 12. Amplifier 125 further includes connections to sources of positive and negative operating supply voltage (not shown).

Gated phase detector output 23 is coupled to an adjustable gain error amplifier 14 having a gain adjustment 15 coupled thereto.

A summing network 16 includes an input 17 coupled to the output of error amplifier 14, an input 18 coupled to a source of nominal frequency signal, and an input 19.

A frequency range control 71 includes a pair of inputs 73 and 74 coupled to sources of maximum and minimum frequency signals 75 and 76 respectively. Frequency range control 71 further includes an input 72 and an output 77. Output 77 is coupled to input 19 of summing network 16. An amplitude limiter and integrating network 70 is coupled to the input horizontal scan flyback signal applied to switch 117 and defines an output coupled to input 72 of frequency range control 71.

A signal controlled current source 30 includes a control input 31 coupled to output 24 of summing network 16 and an output 32 coupled to ground through a capacitor 135. Current source 30 is further coupled to a source of operating supply voltage (not shown). A current mirror 50 includes a switch 53 having a control input 52 and an output 51. Output 51 of switch 53 is coupled to capacitor 135. Current mirror 50 is operatively coupled to current source 30 in a conventional mirror coupling (not shown) such that the current of current mirror 50 is maintained equal to the current of current source 30. A second current mirror 55 is coupled to a source of operating supply voltage (not shown) and to a switch 54. Switch 54 includes a control input 57 and an output 56 coupled to capacitor 135. Current mirror 55 is operatively coupled to current source 30 by conventional current mirror fabrication techniques and maintains an output current equal to twice that of current source 30. A multiscan decoder 60 includes an input 61 coupled to a source of multiscan code signals 64 and a pair of outputs 62 and 63 coupled to control inputs 52 and 57 of switches 53 and 54 respectively.

Saw forming network 33 includes a bistable flip-flop circuit 150 having a reset input 151, a set input 152 and an output 153. An amplifier 130 includes an input 131 coupled to a source of reference voltage (not shown), an input 132 coupled to capacitor 135, and an output 133 coupled to reset input 151 of flip-flop 150. Amplifier 130 further includes connections to sources of positive and negative operating supply voltage (not shown). An amplifier 140 includes an input 141 coupled to capacitor 135, an input 142 coupled to a source of reference voltage (not shown) and an output 143 coupled to set input 152 of flip-flop 150. A current source 136 is coupled between capacitor 135 and ground through a switch 138. Switch 138 includes a control input 137 coupled to output 153 of flip-flop 150. A switch 145 is coupled between capacitor 135 and ground and a shut down signal input 146 is coupled to switch 145. An amplifier 40 includes an input 41 coupled to capacitor 135, an input 42 coupled to a duty cycle adjuster 44, and an output 43 which forms the horizontal drive signal output of generator 10.

In operation, the voltages applied to input 81 of amplifier 80 through resistors 44 and 45 establish the operating bias of amplifier 80 which in turn establishes the DC voltage at output 83 of amplifier 80. Transistor 90 and resistor 94 combine to form the resistive coupling to input 101 of one shot multivibrator 100. Thus, the DC voltages applied to input 81 establish the conduction of transistor 90 and the effective resistance coupled to one shot multivibrator 100. Capacitor 105 and the effective resistance of resistor 94 and transistor 90 form the RC time constant of one shot multivibrator 100. Thus, each time a horizontal sync signal is applied to clear input 103 of one shot multivibrator 100, a constant amplitude constant pulse width signal is produced at output 104 which is applied to input 21 of gated phase detector 12 through pulse shaping network 106. Thus, gated phase detector 12 receives a delayed horizontal sync signal at input 21.

Correspondingly, the horizontal scan derived flyback signal is operative upon switch 117 within differentiating and geometry correcting network 13 to switch current sources 110 and 115 in response to each horizontal flyback pulse. Amplifier 120 cooperates with the switched current sources to produce a differentiated flyback signal which is applied to amplifier 125, the output of which is coupled to input 22 of gated phase detector 12. Amplifier 125 includes a balance input 127 coupled to a source of balance voltage (not shown). As the DC input to input 127 is adjusted, the phasing of output signal at output 128 is correspondingly controlled to affect the desired geometry correction.

In the manner described above, gated phase detector 12 may be constructed in accordance with conventional fabrication techniques and is operative in response to the applied delayed horizontal sync signal and differentiated flyback signal to produce an output signal indicative of the phase and frequency difference therebetween. Thus, the output of gated phase detector 12 at output 23 forms the basic error signal of the present invention horizontal drive generator. Amplifier 14 applies an adjustable gain to the error signal in accordance with the operation of gain adjustment 15. Amplifier 14 also provides an integrating function for the error signal and thus the error signal produced by phase detector 12 is amplified and integrated and thereafter applied to input 17 of summing network 16. A nominal frequency signal 20 is applied to input 18 of summing network 16 to establish a basic or nominal frequency for the horizontal drive generator. The use of an adjustable gain amplifier for amplifier 14 facilitates the control of loop gain within horizontal drive generator 10 in order to accommodate the variety of sync signal characteristics and conditions encountered in various uses. For example, in the event highly stable input synchronizing signals are applied to generator 10 such as those produced by computer systems or the like, the gain of amplifier 14 is preferably set to establish a relatively low loop gain within the system. This low gain prevents the system from responding to signal variations such as those caused by noise or other extraneous information. Conversely, the gain of amplifier 14 is preferably set relatively high to establish a high loop gain within the system to enable the system to rapidly respond to less stable input sync signals such as those from video cassette recorders or the like.

Figure 3:
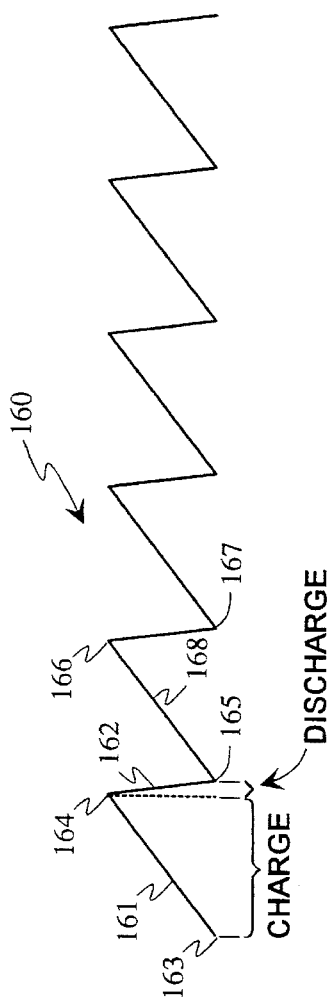
FIG. 3 sets forth an exemplary horizontal scan signal produced by the present invention multisync horizontal drive generator.

The output signal at output 24 of summing network 16 is applied to control the output current of current source 30. Current source 30 is coupled to capacitor 135 within saw forming network 33. Capacitor 135 is charged by current supplied by current source 30 and discharged through the operation of current source 136 and switch 138. Thus, each time switch 138 is open, the current supplied by current source 30 charges capacitor 135. Conversely, with switch 138 closed, current source 136 discharges capacitor 135 to ground. The combination of amplifiers 130 and 140 together with flip-flop circuit 150 operate to repeatedly switch switch 138 between open and closed positions in an operation which is best understood by simultaneous reference to FIG. 3. FIG. 3 sets forth a horizontal saw waveform generally referenced by numeral 160. At the start of a signal cycle, current source 30 begins charging capacitor 135 producing an increasing voltage portion shown by reference numeral 161. As capacitor 135 continues to charge the voltage at input 132, amplifier 130 rises until it exceeds the reference voltage applied to input 131. This point corresponds to peak 164 in curve 160 of FIG. 3. Once the voltage at input 132 reaches the voltage at input 131, amplifier 130 produces an output signal which is applied to reset input 151 of flip-flop 150 causing output 153 to go high which in turn turns on switch 138. With switch 138 turned on, current source 136 begins discharging capacitor 135 producing the downwardly sloped voltage portion 162 in FIG. 3. As the voltage across capacitor 135 continues to be discharged, the voltage applied to input 141 of amplifier 140 decreases to the reference voltage applied to input 142 causing amplifier 140 to produce an output signal at output 143 which is applied to set input 152 of flip-flop 150. The application of signal to set input 152 causes output 153 of flip-flop 150 to go low turning off switch 138. This point corresponds to point 165 of curve 160 in FIG. 3. With switch 138 open, capacitor 135 again begins charging due to the current supplied by current source 30 forming the next rising voltage portion corresponding to slope 168 of curve 160 in FIG. 3. Once again as the voltage across capacitor 135 rises, the point is reached at which amplifier 130 again conducts corresponding to point 166 of curve 160 in FIG. 3 and again switches flip-flop 150 turning on switch 138 and initiating the discharge of capacitor 135. This process continues on a repetitive basis to produce the horizontal scan waveform shown in FIG. 3. It should be noted that the desired horizontal scan signal includes relatively long scan portions corresponding to slopes 161 and 168 in FIG. 3 separated by relatively sharp retrace sloped portions corresponding to slope 162 and the like in FIG. 3. Accordingly, in the preferred embodiment of the present invention, the current flow of current source 136 is substantially greater than that of current source 30. In essence, current source 136 determines the slope of the retrace portion of the scan signal while the current of current source 30 determines the slope of the scan portion of the horizontal scan signal.

Thus, the frequency of horizontal scan signal produced by generator 10 is directly controlled by the current supplied by current source 30. Thus, as the error signal at output 24 of summing network 16 varies in response to gated phase detector 12, the current supplied by current source 30 correspondingly varies to control the frequency of horizontal scan signal produced within saw former 33. In the event the comparison carried forward within detector 12 indicates the frequency of flyback signal is less than the horizontal sync signal, the error signal produced by detector 12 causes an increase in the conduction of current source 30 which in turn increases the frequency of signal produced. Conversely, in the event detector 12 determines that the horizontal scan flyback signal is higher in frequency than the sync signal, the error signal produced by detector 12 causes a reduction in the current of current source 30 which in turn lowers the frequency of the horizontal scan signal produced.

Amplifier 40 receives the horizontal scan signal shown in FIG. 3 and converts it to a series of pulse signals having a frequency corresponding to the horizontal scan signal and having a duty cycle controlled by duty cycle adjustment 44. The resulting output signal at output 43 of amplifier 40 forms the basic horizontal drive signal of generator 10.

Figure 5:
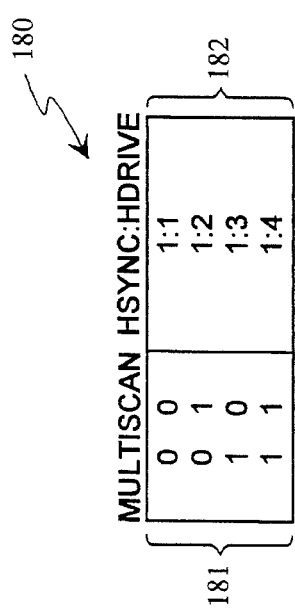
FIG. 5 sets forth a logic table of the multiscan decoder portion of the present invention multisync horizontal drive generator.

In accordance with an important aspect of the present invention, current mirrors 50 and 55 together with switches 53 and 54 cooperate with multiscan decoder 60 to provide frequency multiplication between the horizontal sync signal and the horizontal scan drive signal produced by generator 10. As described above, current mirrors 50 and 55 are operative to produce output currents which track precisely with the current supplied by current source 30 using conventional current mirror technology. Current mirror 50 produces an output current which is an integer one multiple of current source 30 or stated differently, exactly corresponds to current source 30 while current mirror 55 produces an output current which is an integer two or precisely twice that of current source 30. Switches 53 and 54 couple the output currents of current mirrors 50 and 55 to capacitor 135 and are controlled by the operation of multiscan decoder 60. Multiscan decoder 60 in turn is responsive to an input multiscan code applied to input 61. The operation of multiscan decoder 60 and current mirrors 50 and 55 is best understood with simultaneous reference to FIG. 5. FIG. 5 sets forth the relationships between the multiscan input code and the corresponding horizontal sync to horizontal drive signal frequency relationship which results. In FIG. 5, the input multiscan codes 181 are 00, 01, 10, and 11. The corresponding frequency relationships between horizontal sync frequency and horizontal drive signal frequency are shown in column 182 and are 1:1, 1:2, 1:3 and 1:4 respectively. Thus, in the event a horizontal drive signal frequency equal to the horizontal sync frequency is required, the input code applied to multiscan decoder 60 is 00. In response to a 00 input, multiscan decoder 60 opens both switches 53 and 54 and thus the entire charging current applied to capacitor 135 of saw former 33 is supplied by current source 30 and the system operates in the matter described above. In the event, however, it is desired to produce a horizontal drive signal which is double the frequency of the applied horizontal sync, an input code 01 is applied to multiscan decoder 60 in response to which multiscan decoder 60 turns on switch 53 while maintaining switch 54 open. With switch 53 closed, the output current of current mirror 50 together with the current of current source 30 are applied to capacitor 135 effectively doubling the charging current applied to capacitor 135. As described above, the frequency of horizontal drive signal produced by saw forming network 33 corresponds directly to the charging current applied to capacitor 135. Thus, with current mirror 50 and current source 30 providing equal currents to capacitor 135, the charging time is reduced to one-half and the resulting frequency of horizontal drive signal is doubled. As a result, a 1:2 relationship will exist between the horizontal sync and the horizontal drive signal. Similarly, in the event it is desired to produce a horizontal drive signal having a frequency triple that of the horizontal sync signal, an input multiscan code of 10 is applied to multiscan decoder 60. In response to an input code of 10, multiscan decoder 60 turns switch 53 off and turns switch 54 on. It should be recalled that current mirror 55 produces an output current equal to twice that of current source 30. Thus, with switch 54 closed, the total current applied to capacitor 135 is three times that of current source 30 which in turn charges capacitor 135 in one-third its normal time and triples the frequency of horizontal drive signal. Finally, in the event a horizontal drive signal frequency four times that of horizontal sync is desired, a multiscan code 11 is applied to decoder 60 in response to which decoder 60 turns on both switches 53 and 54. With switches 53 and 54 turned on, the combined current charging capacitor 135 is four times the current of current source 30. As a result, capacitor 135 is charged in one-fourth the normal time and the frequency of horizontal drive signal produced is four times the horizontal sync signal frequency.

It will be apparent to those skilled in the art that the ability of the present invention system to produce horizontal drive frequencies equal to integer multiples of the horizontal sync frequency permits the present invention system to function as a scan converter or the like. It will be further apparent to those skilled in the art that while the present invention system is shown using combinations of current source and current mirrors which provide 1:1, 2:1, 3:1 and 4:1 integer multiples, additional current mirrors and frequency multiples may be utilized without departing from the spirit and scope of the present invention.

In accordance with an important aspect of the present invention, horizontal drive generator 10 further includes a frequency range control 71 which together with limiter and integrator 70 is operative to provide an additional signal component to summing network 16 which prevents the horizontal drive frequency from exceeding a predetermined range. Limiter and integrator 70 includes a limiting amplifier and integrator which produces an output signal indicative of the frequency of the horizontal scan system flyback signal. Frequency range control 71 is coupled to frequency maximum and frequency minimum reference signals 75 and 76 and defines a transfer function generally referenced by numeral 170 and shown in FIG. 4. With temporary reference to FIG. 4, transfer function 170 is shown plotted against a vertical axis 171 representing output signal and a horizontal axis 172 representing frequency. Transfer function 170 defines a frequency maximum 173 and a frequency minimum 174. Transfer function 170 further defines a negative going slope 175 extending downwardly from frequency maximum point 173 and an upwardly extending positive going slope portion 176 extending from frequency minimum 174. Thus, as the applied frequency indicative signal from limiter and integrator 70 remains between frequency maximum point 173 and frequency minimum point 174, the output of frequency range control 71 remains zero. As a result, so long as the horizontal drive signal as indicated by the detected frequency of the flyback pulse remains within the frequency range established by frequency maximum 173 and frequency minimum 174, no additional signal component is applied at input 19 of summing network 16. Under these conditions, generator 10 functions in the manner described above. In the event however the frequency of horizontal drive signal exceeds frequency maximum 173, a frequency reducing signal component is produced by range control 71 and is effective to produce a frequency decreasing component to the error signal at output 24 of summing network 16. In response to this decreasing component, the current of current source 30 is correspondingly reduced which in turn lengthens the charging time of capacitor 135 and lowers the frequency of the horizontal drive signal. Conversely, in the event the frequency of the horizontal drive signal drops below frequency minimum 174, a frequency increasing component is applied to summing network 16 causing an increase in current of current source 30 and a decrease in the charging time of capacitor 135. With decreased charging time of capacitor 135, the frequency of the horizontal drive signal is increased. As a result, frequency range control 71 remains inoperative and does not interfere with the normal operation of horizontal drive generator 10 so long as the signal frequency remains within the established frequency range.

What has been shown is a multisync horizontal drive generator in which the phase-locked loop gain of the control system may be adjusted to accommodate the characteristics of the applied horizontal sync signals. The system further provides a range control feature which prevents the frequency of the horizontal drive signals from exceeding a programmable maximum frequency or from falling below a programmable minimum frequency. Finally, a novel current mirror based system is utilized to facilitate the generation of horizontal drive signals having integer multiples of the input sync signal frequency without interfering with the phase-locked loop operation of the system.

While particular embodiments of the invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention.

That which is claimed is:

1. In a raster scanned video display system producing a flyback signal and receiving a reference horizontal sync signal, a method of generating a horizontal scan drive signal comprising the steps of:

producing an error signal indicative of the phase and frequency relationship between the flyback signal and the reference horizontal sync signal;

generating a reference current responsive to said error signal;

generating a first mirror current equal to an integer multiple N of said reference current;

repeatedly switching a capacitor from charge to discharge;

applying said reference current to charge said capacitor during said charging to produce a horizontal scan signal having a frequency equal to that of said sync signal or applying said first mirror current together with said reference current to charge said capacitor during said charging to produce a horizontal scan signal having a frequency equal to an integer multiple, N+1, of the frequency of said sync signal.

2. The method of claim 1 further including the step of generating a second mirror current equal to an integer multiple, M, of said reference current.

3. The method of claim 2 wherein said applying step further includes alternatively combining said first or second mirror currents with said reference current or said first and second mirror currents with said reference current to charge said capacitor during said charging to produce a horizontal scan signal having a frequency equal to an integer multiple N+1, M+1, or N+M+1 of said sync signal frequency.

4. The method of claim 3 wherein said applying step includes the steps of:

assigning a plurality of digital multisync codes each defining an integer frequency multiple;

decoding said digital multisync code; and combining said first or second mirror currents or said first and second mirror currents with said reference current in response to said multisync code.

5. The method of claim 4 wherein said integer multiple N of said first mirror current is 1 and said integer multiple M of said second mirror current is two.

6. The method of claim 5 wherein said producing step includes the steps of combining said error signal with a geometry correction signal component to produce a composite error signal which is used in said step of generating a reference current.

7. In a raster scanned video display system producing a flyback signal and receiving a reference horizontal sync signal, a horizontal scan drive signal generator comprising:

means for producing an error signal indicative of the phase and frequency relationship between the flyback signal and the reference horizontal sync signal;

means for generating a reference current responsive to said error signal;

means for generating a first mirror current equal to an integer multiple N of said reference current;

means for repeatedly switching a capacitor from charge to discharge;

means for applying said reference current to charge said capacitor during said charging to produce a horizontal scan signal having a frequency equal to that of said sync signal or applying said first mirror current together with said reference current to charge said capacitor during said charging to produce a horizontal scan signal having a frequency equal to an integer multiple, N+1, of the frequency of said sync signal.

8. A horizontal scan drive signal generator as set forth in claim 7 further including means for generating a second mirror current equal to an integer multiple, M, of said reference current.

9. A horizontal scan drive signal generator as set forth in claim 8 wherein said means for applying further includes means for alternatively combining said first or second mirror currents with said reference current or said first and second mirror currents with said reference current to charge said capacitor during said charging to produce a horizontal scan signal having a frequency equal to an integer multiple, N+1, M+1, or N+M+1 of said sync signal frequency.

10. A horizontal scan drive signal generator as set forth in claim 9 wherein said means for applying includes:

means for assigning a plurality of digital multisync codes each defining an integer frequency multiple;

means for decoding said digital multisync code; and means for combining said first or second mirror currents or said first and second mirror currents with said reference current in response to said multisync code.

11. A horizontal scan drive signal generator as set forth in claim 10 wherein said integer multiple N of said first mirror current is 1 and said integer multiple M of said second mirror current is two.

12. In a raster scanned video display system producing a flyback signal and receiving a reference horizontal sync signal, a horizontal scan drive signal generator comprising:

a phase and frequency detector having a first input coupled to said sync signal, a second input coupled to said flyback signal and an error signal output producing an error signal indicative of the phase and frequency of said flyback signal with respect to said sync signal;

a current source coupled to said phase and frequency detector producing a reference current controlled by said error signal;

a plurality of current mirrors producing a plurality of mirror currents each equal to an integer multiple of said reference current;

scan signal means coupled to said current source for forming a scan signal having a frequency related to the current applied thereto;

switching means for selectively coupling one or more of said current mirrors to said scan signal means to cause said scan signal means to form a scan signal having a frequency equal to an integer multiple of said sync signal frequency.

13. The method of claim 1 wherein said producing step includes the steps of:

establishing a maximum horizontal scan drive signal frequency and a minimum horizontal scan drive signal frequency;

comparing said flyback signal to said horizontal scan drive signal; and adding an out of range signal component to said error signal when said horizontal scan drive signal exceeds said maximum frequency or is less than said minimum frequency.

14. The method of claim 1 wherein said producing step includes the step of amplifying said error signal by a gain factor selected as a function of reference horizontal sync signal stability.

15. A horizontal scan drive signal generator as set forth in claim 7 wherein said means for producing includes:

means for establishing a maximum horizontal scan drive signal frequency and a minimum horizontal scan drive signal frequency;

means for comparing said flyback signal to said horizontal scan drive signal; and means for adding an out of range signal component to said error signal when said horizontal scan drive signal exceeds said maximum frequency or is less than said minimum frequency.

16. A horizontal scan drive signal generator as set forth in claim 7 wherein said means for producing includes means for amplifying said error signal by a gain factor selected as a function of reference horizontal sync signal stability.

* * * * *